United States Patent [19]

Koo et al.

[11] Patent Number: 5,499,300
[45] Date of Patent: Mar. 12, 1996

[54] STEREO AND DUAL AUDIO SIGNAL IDENTIFYING CIRCUIT

[75] Inventors: Seung-yub Koo, Seoul; Young-ho Shin, Kyungki, both of Rep. of Korea

[73] Assignee: Samsung Electronics Co., Ltd., Suwon, Rep. of Korea

[21] Appl. No.: 184,181

[22] Filed: Jan. 21, 1994

[30] Foreign Application Priority Data

Jan. 21, 1993 [KR] Rep. of Korea .......................... 93-726

[51] Int. Cl.⁶ ...................................................... H04H 5/00
[52] U.S. Cl. ................................................ 381/12; 381/4
[58] Field of Search .................. 381/12, 3–4; 455/154.1, 455/207, 260

[56] References Cited

U.S. PATENT DOCUMENTS 4,249,038  2/1981  Stienstra ........................................ 381/4
4,584,708  4/1986  Eilers et al. ................................... 381/4

Primary Examiner—Stephen Brinich
Attorney, Agent, or Firm—Stephen R. Whitt; Charles R. Donohoe

[57] ABSTRACT

A stereo and dual audio signal identifying circuit including an FM detector receiving a second intermediate frequency signal, a bandpass filter, an AM detector. The circuit further including an amplifier having a first input receiving an output signal from the AM detector, and a second input receiving a signal derived from a series connected resistor and DC-filtering capacitor connected between the second input and ground, and having a feedback resistor connected between the second amplifier input and the amplifier. The amplifier drives a second stage of the circuit including a voltage controlled oscillator, a phase detector and a low-pass filter. The particular disposition of the DC-filtering capacitor within the circuit allows the capacitor to be externally connected to a single pin in an IC package incorporating the circuit.

9 Claims, 3 Drawing Sheets

STEREO AND DUAL AUDIO SIGNAL IDENTIFYING CIRCUIT

BACKGROUND OF THE INVENTION

The present invention relates to an improved circuit for identifying stereo and dual audio signals. In particular, the present invention provides a circuit for identifying stereo and dual audio signals which can be readily integrated into a package having fewer external pins.

Conventional integrated circuits (ICs) which identify stereo and dual audio signals require numerous external connection pins. Such an abundance of pins increases overall production costs.

FIG. 1 is a block diagram of a conventional circuit which identifies stereo and dual audio signals. The circuit includes an FM detector 1 which receives a second intermediate frequency (2nd IF) signal input, a bandpass filter 2, an AM detector 3 which receives the bandpass-filtered output from the FM detector, and a filtering capacitor 4. The circuit also includes an amplifier 5 having a first input receiving the capacitor-filtered output from the AM detector, and a second input receiving a signal derived from a series connected resistor 6 and a voltage source 7 between the second input and ground, and a feedback resistor 8 connected between the output of amplifier 5 and the second input. The circuit further includes a phase detector 10 which accepts as inputs, dual outputs from a voltage controlled oscillator 9, the output of amplifier 5, and a signal apparent at a common node between resistor 6 and voltage source 7, wherein voltage controlled oscillator 9 accepts as an input, the output of phase detector 10 through a low-pass filter 11.

In operation, FM detector 1 in the foregoing circuit detects the presence of an FM wave on the 2nd IF input. Bandpass filter 2 receives and filters the FM-detected signal to thereby detect a predetermined pilot signal. AM detector 3 detects the presence of an AM wave modulating the pilot signal. Capacitor 4 removes any DC component riding on the detected AM wave to prevent its transmission to amplifier 5. Amplifier 5 amplifies the detected AC component of the AM wave in order to drive the next stage of the circuit. Due to variations in the DC level of the AM wave resulting from varying degrees of modulation in the broadcasting transmission, the state of the electrical field in the broadcasting reception, etc., the output of AM detector 3 cannot be used as a direct, or uncompensated input to phase detector 10 which performs phase detection in a regular DC bias state. Therefore, the output of amplifier 5 having AC components detected using capacitor 4 is used as an input of phase detector 10. The voltage controlled oscillator 9, phase detector 10, and low-pass filter 11 function as a phase-locked loop.

When the foregoing circuit is integrated, capacitor 4 remains external to the IC and must communicate through two external pins. The external attachment of capacitor 4, thus, drives up the pin count, and the corresponding production costs for conventional ICs incorporating a stereo and dual audio signal identifying circuit.

SUMMARY OF THE INVENTION

Therefore, it is an object of the present invention to provide a stereo and dual audio signal identifying circuit which can be integrated in a package having a reduced numbers of pins.

To accomplish this object, the stereo and dual sound identifying system according to the present invention comprises: an FM detecting means for receiving and FM-detecting a second intermediate frequency signal; a bandpass filter for bandpass-filtering the output signal of the FM detector, an AM detecting means for receiving the bandpass-filtered signal and detecting an AM wave; an amplifier having a positive input terminal which receives the output signal of the AM detecting means; a first resistor and a capacitor which are serially connected between the negative input terminal of the amplifier and ground; a second resistor connected between the negative input terminal of the amplifier and the output terminal thereof; a phase-locked loop having a first positive terminal which inputs the output signal of the amplifier and a first negative terminal connected to the common node of the first resistor and the capacitor and second positive and negative terminals which input the signals of the output terminals of the phased-locked loop, for synchronizing phases of input and output signals.

BRIEF DESCRIPTION OF THE DRAWINGS

The above object and other advantages of the present invention will become more apparent by describing in detail a preferred embodiment with reference to the attached drawings in which.

DETAILED DESCRIPTION OF THE INVENTION

Figure 1:
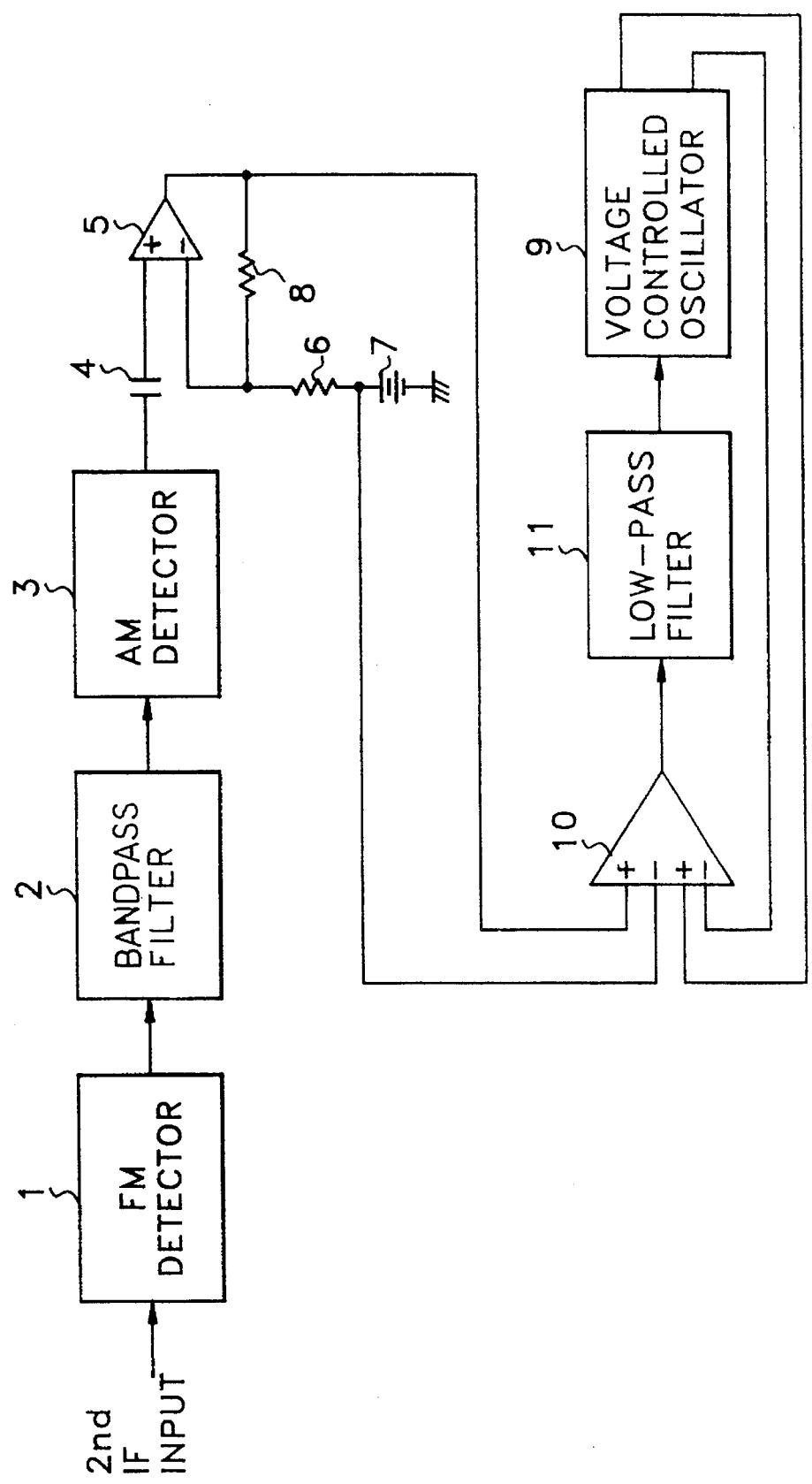
FIG. 1 is a block diagram of a conventional stereo and dual audio signal identifying circuit.
Figure 2:
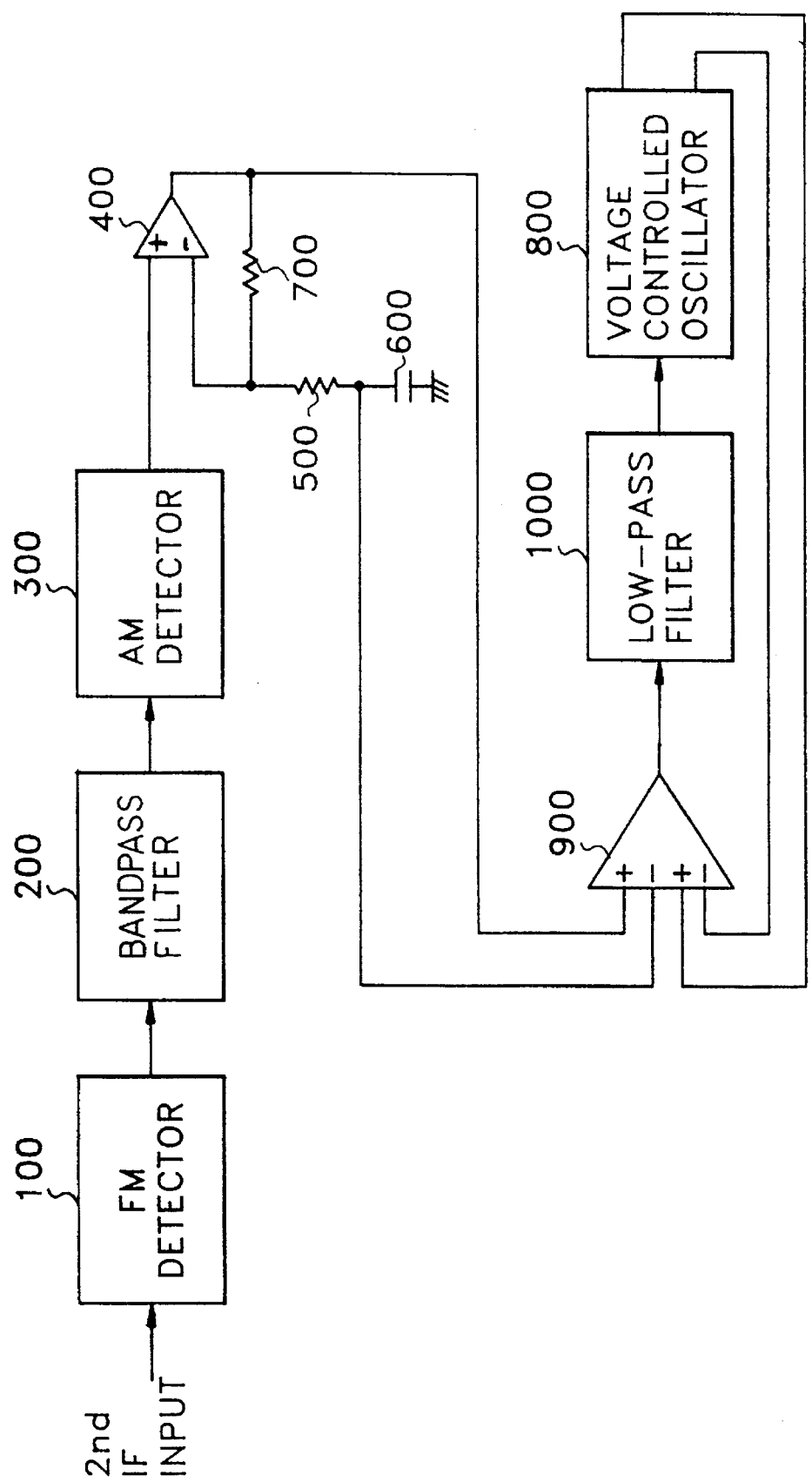
FIG. 2 is a block diagram of the stereo and dual audio signal identifying circuit according to the present invention.

As shown in FIG. 2, a preferred embodiment of the present invention includes an FM detector 100, a bandpass filter 200, an AM detector 300, an amplifier 400 having a first input receiving an output of AM detector 300, and a second input receiving a signal derived from a series combination of a resistor 500 and a capacitor 600 connected between the second input of the amplifier 400 and ground. A feedback resistor 700 is also connected connected between the second input of amplifier 400 and the output of amplifier 400. The preferred embodiment also includes a phase detector 900 having first positive input connected to the output of the amplifier 400, a first negative input connected to a common node between resistor 500 and capacitor 600, second positive input and second negative inputs connected to dual outputs of a voltage controlled oscillator 800 through a low-pass filter 1000. The voltage controlled oscillator 800 generates a predetermined frequency to drive one side of phase detector 900. In the configuration described above, capacitor 600 is externally attached to an incorporating IC but only occupies a single pin.

In operation, the preferred embodiment described above functions in much the same manner as the previously described conventional circuit. FM detector 100 detects the presence of an FM waveform in the input 2nd IF signal. Bandpass filter 200 receives and filters the FM-detected signal to thereby detect a predetermined pilot signal. AM detector 300 detects the presence of an AM wave modulating the pilot signal. Capacitor 600 removes any DC component biasing the detected AM wave and thus prevents application of the DC component to amplifier 400. Amplifier 400 amplifies the output signal of AM detector 300 and the detected AC component AM wave in order to drive the second stage of the circuit. In other words, even if the output of the AM detector 300 varies, the output of amplifier 400 and the signal derived from the common node between resistor 500 and capacitor 600 can be used as inputs to phase detector 900 by connecting capacitor 600 between the common node and ground. This assures that a proper DC level is maintained at amplifier 400. The voltage controlled oscillator 800, phase detector 900 and low-pass filter 1000 function in combination as a phase-locked loop for synchronizing signal phase.

Figure 3:
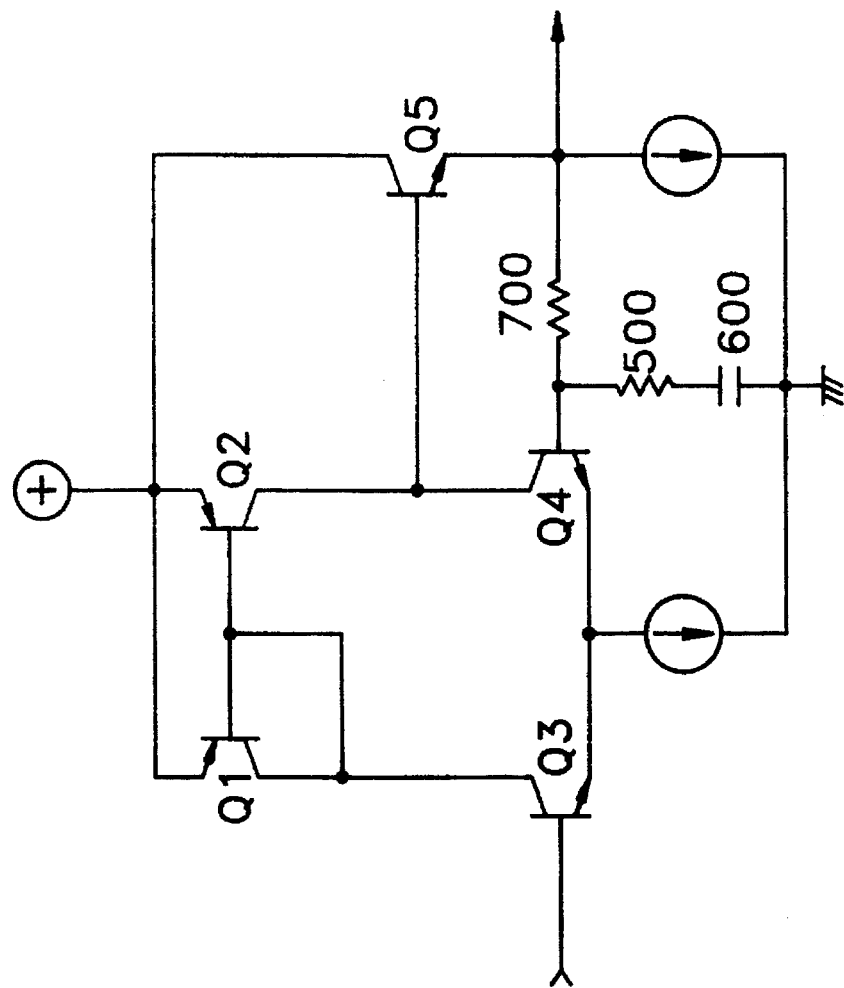
FIG. 3 is a detailed circuit diagram of the amplifier shown in FIG. 2.

FIG. 3 is a detailed circuit diagram of a preferred embodiment of the amplifier 400 shown in FIG. 2. As shown in FIG. 3, the circuit includes a transistors Q1, Q2, Q3, Q4, and Q5. Transistor Q1 has an emitter connected to a voltage source, and a commonly connected collector and base. Transistor Q2 has an emitter connected to the voltage source, a collector connected to the collector of transistor Q4, and a base connected to the base of transistor Q1 and to a collector of transistor Q3. The base of transistor Q3 receives an input signal. Transistor Q4 also has an emitter connected to the emitter of transistor Q3. A first constant current source is connected between the common emitter node of transistors Q3 and Q4 and ground. Transistor Q5 has a base is connected to the collector of transistor Q4, and a collector connected to the voltage source. A resistor 700 connected between a base of transistor Q4 and an emitter of transistor Q5. A resistor 500 and a capacitor 600 are series is connected between the base of transistor Q4 and ground, and a second constant current source is connected between the emitter of transistor Q5 and ground.

The current flowing through transistors Q3 and Q4 is regulated by the current mirror circuit of transistor Q1 and Q2, and by the output to the base of transistor Q5. Gain is determined by the opposing input terminal of the differential amplifier (i.e., the base of Q4) and by the feedback current through resistors 700 and 500. The output of amplifier 400 and the signal apparent at a common node between resistor 500 and capacitor 600 are used as inputs to phase detector 900 in the second stage of the circuit.

The disposition of capacitor 600 within the foregoing circuit allows the capacitor to occupy but a single external pin in an IC package incorporating the stereo and dual audio signal identifying circuit of the present invention. This allow the number of external pins on the chip to be reduced by one, relative to the conventional circuit which requires two pins to externally attach a corresponding capacitor. The resulting reduction in the required external pin count reduces production costs for the chip.

The present invention has been described with reference to the foregoing preferred embodiment, it is not limited to this embodiment. Those of ordinary skill in the art will recognize that exemplary embodiment is subject to adaptations, modifications and routine design variations which will fall well within the subject matter of the present invention as defined by the following claims.

What is claimed is:

1. A stereo and dual audio signal identifying circuit, comprising:

an FM detector receiving an input signal, and detecting the presence of an FM waveform in the input signal;

a bandpass filter receiving an output from the FM detector;

an AM detector receiving a bandpass filtered output of the FM detector, and detecting the presence of an AM waveform in the bandpass-filtered output of the FM detector;

an amplifier having first and second inputs and an output, the first amplifier input receiving an output signal of the AM detector;

a resistor and a capacitor connected in series between the second amplifier input and ground;

a feedback resistor connected between the second amplifier input and the amplifier output; and, a phase-locked loop having first and second positive inputs, first and second negative inputs, and first and second outputs, the first positive input being connected to the amplifier output, the first negative input being connected to a common node between the series connected resistor and capacitor, the second positive and second negative inputs being respectively connected to the first and second outputs.

2. The stereo and dual audio signal identifying circuit of claim 1, wherein the input signal is an intermediate frequency.

3. The stereo and dual audio signal identifying circuit of claim 1, wherein the amplifier further comprises:

a first transistor having first collector, first emitter and first base, the first emitter being connected to a voltage source, and the first collector and first base being commonly connected;

a second transistor having second collector, second emitter and second base, the second emitter connected to the voltage source, and the second base being connected to the first base;

a third transistor having third collector, third emitter, and third base, the third collector being connected to the first collector, and the third base receiving, as an input signal, an output from the AM detector;

a fourth transistor having fourth collector, fourth emitter and fourth base, the fourth collector being connected to the second collector, and the fourth emitter being connected to the third emitter at a common emitter node;

a first constant current source connected between the common emitter node of the third and fourth transistors and ground;

a fifth transistor having fifth collector, fifth emitter, and fifth base, the fifth base being connected to the fourth collector, the fifth collector being connected to the voltage source, and the fifth emitter being connected to an output for the amplifier;

a second constant current source connected between the fifth emitter and ground;

wherein the feedback resistor is connected between the fourth base and the fifth emitter, and the series connected resistor and capacitor are connected between the fourth base and ground.

4. A stereo and dual audio signal identifying circuit, comprising:

an FM detector receiving an input signal and generating an FM detected output;

a bandpass filter receiving the FM detected output and generating a bandpassed output;

an AM detector receiving the bandpassed output and generating and AM detected output;

an amplifier generating an amplified signal at an output and comprising;

a first input receiving the AM detected output, a second input connected to ground through a series connected resistor and capacitor, and a feedback resistor connected between the output and the second input; and, a phase-locked loop circuit receiving the amplified signal.

5. The stereo and dual audio signal identifying circuit of claim 4, wherein the phase-locked loop further comprises:

a phase detector receiving the amplified signal and at least one feedback signal and generating a phase detected signal; and a voltage controlled oscillator providing the at least one feedback signal to the phase detector.

6. The stereo and dual audio signal identifying circuit of claim 5, wherein the phase-locked loop further comprises:

a low-pass filter interposed between the phase detector and voltage controlled oscillator receiving the phase detected signal and generating a filtered signal applied to the voltage controlled oscillator.

7. The stereo and dual audio signal identifying circuit of claim 6, wherein the voltage controlled oscillator provides first and second feedback signals, and the phase detector further comprises:

a first positive differential input receiving the amplified signal;

a first negative differential input receiving a signal apparent at a voltage node between the series connected resistor and capacitor;

a second positive differential input receiving the first feedback signal; and, a second negative differential input receiving the second feedback signal.

8. A stereo and dual audio signal identifying circuit, comprising:

an FM detector receiving an input signal and generating an FM detected output;

a bandpass filter receiving the FM detected output and generating a bandpassed output;

an AM detector receiving the bandpassed output and generating and AM detected output;

an amplifier generating an amplified signal at an output and comprising;

a first transistor receiving the AM detected output at a first base, and having a first emitter connected to a first constant current source, and a second transistor controlling gain of the amplifier and having a second emitter connected to the first constant current source and second base connected to the output through a feedback circuit; and, a phase-locked loop circuit receiving the amplified signal.

9. The stereo and dual audio signal identifying circuit, of claim 8 wherein the feedback circuit comprises:

a feedback resistor connected between the second base and the output; and, a series connected resistor and capacitor connected between the second base and ground.

* * * * *